United States Patent
Keyse et al.

(10) Patent No.: US 12,401,293 B2
(45) Date of Patent: Aug. 26, 2025

(54) SYSTEMS AND METHODS FOR OSCILLATOR CALIBRATOR FOR INVERTER FOR ELECTRIC VEHICLE

(71) Applicant: BorgWarner US Technologies LLC, Wilmington, DE (US)

(72) Inventors: Mark Russell Keyse, Sharpsville, IN (US); Jack Lavern Glenn, Union Pier, MI (US)

(73) Assignee: BorgWarner US Technologies LLC, Wilmington, DE (US)

( * ) Notice: Subject to any disclaimer, the term of this patent is extended or adjusted under 35 U.S.C. 154(b) by 292 days.

(21) Appl. No.: 18/063,332

(22) Filed: Dec. 8, 2022

(65) Prior Publication Data
US 2024/0103559 A1 Mar. 28, 2024

Related U.S. Application Data

(60) Provisional application No. 63/377,486, filed on Sep. 28, 2022, provisional application No. 63/377,501, (Continued)

(51) Int. Cl.
*H02P 27/06* (2006.01)
*B60L 3/00* (2019.01)
(Continued)

(52) U.S. Cl.
CPC .............. *H02P 27/06* (2013.01); *B60L 3/003* (2013.01); *B60L 15/007* (2013.01); *B60L 15/08* (2013.01);
(Continued)

(58) Field of Classification Search
CPC .......... H02P 27/00; H02P 27/06; H02M 1/00; H02M 7/53873; B60L 53/20; B60L 53/22;
(Continued)

(56) References Cited

U.S. PATENT DOCUMENTS

| 4,054,828 A | 10/1977 | Conzelmann et al. |
| 4,128,801 A | 12/1978 | Gansert et al. |

(Continued)

FOREIGN PATENT DOCUMENTS

| WO | 2007093598 A1 | 8/2007 |
| WO | 2019034505 A1 | 2/2019 |

(Continued)

OTHER PUBLICATIONS

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.

(Continued)

*Primary Examiner* — Hai L Nguyen
(74) *Attorney, Agent, or Firm* — Joshua M. Haines; Bookoff McAndrews, PLLC

(57) ABSTRACT

A system comprises an inverter configured to convert DC power from a battery to AC power to drive a motor, wherein the inverter includes: a galvanic isolator separating a high voltage area from a low voltage area; a low voltage phase controller in the low voltage area, the low voltage phase controller configured to receive a clock reference signal; and a high voltage phase controller in the high voltage area, the high voltage phase controller configured to align a clock reference signal of the high voltage phase controller with the clock reference signal of the low voltage phase controller.

8 Claims, 6 Drawing Sheets

Related U.S. Application Data filed on Sep. 28, 2022, provisional application No. 63/377,512, filed on Sep. 28, 2022, provisional application No. 63/378,601, filed on Sep. 28, 2022.

(51) Int. Cl.

| | |
|---|---|
| *B60L 15/00* | (2006.01) |
| *B60L 15/08* | (2006.01) |
| *B60L 50/40* | (2019.01) |
| *B60L 50/51* | (2019.01) |
| *B60L 50/60* | (2019.01) |
| *B60L 50/64* | (2019.01) |
| *B60L 53/20* | (2019.01) |
| *B60L 53/22* | (2019.01) |
| *B60L 53/62* | (2019.01) |
| *B60R 16/02* | (2006.01) |
| *G01R 15/20* | (2006.01) |
| *G06F 1/08* | (2006.01) |
| *G06F 13/40* | (2006.01) |
| *H01L 21/48* | (2006.01) |
| *H01L 23/00* | (2006.01) |
| *H01L 23/15* | (2006.01) |
| *H01L 23/367* | (2006.01) |
| *H01L 23/373* | (2006.01) |
| *H01L 23/40* | (2006.01) |
| *H01L 23/467* | (2006.01) |
| *H01L 23/473* | (2006.01) |
| *H01L 23/495* | (2006.01) |
| *H01L 23/538* | (2006.01) |
| *H01L 25/00* | (2006.01) |
| *H01L 25/07* | (2006.01) |
| *H02J 7/00* | (2006.01) |
| *H02M 1/00* | (2006.01) |
| *H02M 1/08* | (2006.01) |
| *H02M 1/084* | (2006.01) |
| *H02M 1/088* | (2006.01) |
| *H02M 1/12* | (2006.01) |
| *H02M 1/32* | (2007.01) |
| *H02M 1/42* | (2007.01) |
| *H02M 1/44* | (2007.01) |
| *H02M 3/335* | (2006.01) |
| *H02M 7/00* | (2006.01) |
| *H02M 7/537* | (2006.01) |
| *H02M 7/5387* | (2007.01) |
| *H02M 7/5395* | (2006.01) |
| *H02P 27/08* | (2006.01) |
| *H02P 29/024* | (2016.01) |
| *H02P 29/68* | (2016.01) |
| *H05K 1/14* | (2006.01) |
| *H05K 1/18* | (2006.01) |
| *H05K 5/02* | (2006.01) |
| *H05K 7/20* | (2006.01) |
| *H10D 64/01* | (2025.01) |
| *B60L 15/20* | (2006.01) |
| *H03K 19/20* | (2006.01) |

(52) U.S. Cl.
CPC .............. *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01); *G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H02J 7/0063* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2039* (2013.01); *H05K 7/2049* (2013.01); *H05K 7/20854* (2013.01); *H05K 7/209* (2013.01); *H05K 7/20927* (2013.01); *H10D 64/018* (2025.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02P 2207/05* (2013.01); *H03K 19/20* (2013.01); *H05K 2201/042* (2013.01); *H05K 2201/10166* (2013.01)

(58) Field of Classification Search
CPC .......... B60L 50/00; B60L 50/14; B60L 50/60; B60L 50/51; B60L 2210/40; B60L 2210/42; B60L 2210/44; B60L 2210/46; B60L 2210/00; H03K 17/063; G06F 1/08; G06F 1/12
USPC .................................. 318/800–803
See application file for complete search history.

(56) References Cited

U.S. PATENT DOCUMENTS

| | | |
|---|---|---|
| 4,564,771 A | 1/1986 | Flohrs |
| 4,618,875 A | 10/1986 | Flohrs |
| 4,716,304 A | 12/1987 | Fiebig et al. |
| 5,068,703 A | 11/1991 | Conzelmann et al. |
| 5,432,371 A | 7/1995 | Denner et al. |
| 5,559,661 A | 9/1996 | Meinders |
| 5,654,863 A | 8/1997 | Davies |
| 5,764,007 A | 6/1998 | Jones |
| 5,841,312 A | 11/1998 | Mindl et al. |
| 6,028,470 A | 2/2000 | Michel et al. |
| 6,163,138 A | 12/2000 | Kohl et al. |
| 6,351,173 B1 | 2/2002 | Ovens et al. |
| 6,426,857 B1 | 7/2002 | Doster et al. |
| 6,597,556 B1 | 7/2003 | Michel et al. |
| 6,812,553 B2 | 11/2004 | Gerbsch et al. |
| 6,943,293 B1 | 9/2005 | Jeter et al. |
| 7,095,098 B2 | 8/2006 | Gerbsch et al. |
| 7,229,855 B2 | 6/2007 | Murphy |
| 7,295,433 B2 | 11/2007 | Taylor et al. |

(56) References Cited

U.S. PATENT DOCUMENTS

| | | |
|---|---|---|
| 7,459,954 B2 | 12/2008 | Kuehner et al. |
| 7,538,425 B2 | 5/2009 | Myers et al. |
| 7,551,439 B2 | 6/2009 | Peugh et al. |
| 7,616,047 B2 | 11/2009 | Rees et al. |
| 7,724,046 B2 | 5/2010 | Wendt et al. |
| 7,750,720 B2 | 7/2010 | Dittrich |
| 9,088,159 B2 | 7/2015 | Peuser |
| 9,275,915 B2 | 3/2016 | Heinisch et al. |
| 9,373,970 B2 | 6/2016 | Feuerstack et al. |
| 9,431,932 B2 | 8/2016 | Schmidt et al. |
| 9,515,584 B2 | 12/2016 | Koller et al. |
| 9,548,675 B2 | 1/2017 | Schoenknecht |
| 9,806,607 B2 | 10/2017 | Ranmuthu et al. |
| 9,843,320 B2 | 12/2017 | Richter et al. |
| 9,871,444 B2 | 1/2018 | Ni et al. |
| 9,882,490 B2 | 1/2018 | Veeramreddi et al. |
| 10,111,285 B2 | 10/2018 | Shi et al. |
| 10,116,300 B2 | 10/2018 | Blasco et al. |
| 10,232,718 B2 | 3/2019 | Trunk et al. |
| 10,270,354 B1 | 4/2019 | Lu et al. |
| 10,291,225 B2 | 5/2019 | Li et al. |
| 10,525,847 B2 | 1/2020 | Strobel et al. |
| 10,797,579 B2 | 10/2020 | Hashim et al. |
| 10,924,001 B2 | 2/2021 | Li et al. |
| 11,082,052 B2 | 8/2021 | Jang et al. |
| 11,108,389 B2 | 8/2021 | Li et al. |
| 11,342,911 B2 | 5/2022 | Lee et al. |
| 11,838,011 B2 | 12/2023 | Li et al. |
| 11,843,320 B2 | 12/2023 | Sivakumar et al. |
| 11,848,426 B2 | 12/2023 | Zhang et al. |
| 11,851,038 B2 | 12/2023 | Solanki et al. |
| 11,855,522 B2 | 12/2023 | Rudolph et al. |
| 11,855,630 B2 | 12/2023 | Dake et al. |
| 11,870,338 B1 | 1/2024 | Narayanasamy |
| 11,872,997 B2 | 1/2024 | Hoos et al. |
| 11,881,859 B2 | 1/2024 | Gupta et al. |
| 11,888,391 B2 | 1/2024 | Balasubramanian et al. |
| 11,888,393 B2 | 1/2024 | Venkateswaran et al. |
| 11,901,803 B2 | 2/2024 | Ruck et al. |
| 11,901,881 B1 | 2/2024 | Narayanasamy |
| 11,909,319 B2 | 2/2024 | Esteghlal et al. |
| 11,916,426 B2 | 2/2024 | Oner et al. |
| 11,923,762 B2 | 3/2024 | Sethumadhavan et al. |
| 11,923,764 B1 | 3/2024 | Zhang |
| 11,923,799 B2 | 3/2024 | Ojha et al. |
| 11,925,119 B2 | 3/2024 | Male et al. |
| 11,927,624 B2 | 3/2024 | Patel et al. |
| 11,938,838 B2 | 3/2024 | Simonis et al. |
| 11,942,927 B2 | 3/2024 | Purcarea et al. |
| 11,942,934 B2 | 3/2024 | Ritter |
| 11,945,331 B2 | 4/2024 | Blemberg et al. |
| 11,945,522 B2 | 4/2024 | Matsumura et al. |
| 11,949,320 B2 | 4/2024 | Jaladanki et al. |
| 11,949,333 B2 | 4/2024 | Pahkala et al. |
| 11,955,896 B2 | 4/2024 | Liu et al. |
| 11,955,953 B2 | 4/2024 | Sinn et al. |
| 11,955,964 B2 | 4/2024 | Agarwal et al. |
| 11,962,234 B2 | 4/2024 | Narayanasamy et al. |
| 11,962,291 B2 | 4/2024 | Oberdieck et al. |
| 11,964,587 B2 | 4/2024 | Yukawa |
| 11,970,076 B2 | 4/2024 | Sarfert et al. |
| 11,977,404 B2 | 5/2024 | Chandrasekaran |
| 11,984,802 B2 | 5/2024 | Merkin et al. |
| 11,984,876 B2 | 5/2024 | Neidorff et al. |
| 11,990,776 B2 | 5/2024 | Dulle |
| 11,990,777 B2 | 5/2024 | Woll et al. |
| 11,996,686 B2 | 5/2024 | Chan et al. |
| 11,996,699 B2 | 5/2024 | Vasconcelos Araujo et al. |
| 11,996,714 B2 | 5/2024 | El Markhi et al. |
| 11,996,715 B2 | 5/2024 | Nandi et al. |
| 11,996,762 B2 | 5/2024 | Hembach et al. |
| 11,996,830 B2 | 5/2024 | Murthy et al. |
| 11,996,847 B1 | 5/2024 | Kazama et al. |
| 12,003,191 B2 | 6/2024 | Chaudhary et al. |
| 12,003,229 B2 | 6/2024 | Kaya et al. |
| 12,003,237 B2 | 6/2024 | Waters |
| 12,008,847 B2 | 6/2024 | Braun et al. |
| 12,009,679 B2 | 6/2024 | Gottwald et al. |
| 12,012,057 B2 | 6/2024 | Schneider et al. |
| 12,015,342 B2 | 6/2024 | Kienzler et al. |
| 12,019,112 B2 | 6/2024 | Jarmolowitz et al. |
| 12,021,517 B2 | 6/2024 | S et al. |
| 12,122,251 B2 * | 10/2024 | Glenn .................. H01L 25/072 |
| 2009/0147545 A1 | 6/2009 | Melanson |
| 2017/0331469 A1 | 11/2017 | Kilb et al. |
| 2019/0372749 A1 | 12/2019 | Ikeda et al. |
| 2020/0195121 A1 | 6/2020 | Keskar et al. |
| 2021/0005711 A1 | 1/2021 | Martinez-Limia et al. |
| 2022/0052610 A1 | 2/2022 | Plum |
| 2022/0294441 A1 | 9/2022 | Purcarea et al. |
| 2023/0010616 A1 | 1/2023 | Gschwantner et al. |
| 2023/0061922 A1 | 3/2023 | Ritter |
| 2023/0082076 A1 | 3/2023 | Strache et al. |
| 2023/0126070 A1 | 4/2023 | Oberdieck et al. |
| 2023/0179198 A1 | 6/2023 | Winkler |
| 2023/0231210 A1 | 7/2023 | Joos et al. |
| 2023/0231400 A1 | 7/2023 | Oberdieck et al. |
| 2023/0231496 A1 | 7/2023 | Syed et al. |
| 2023/0238808 A1 | 7/2023 | Swoboda et al. |
| 2023/0268826 A1 | 8/2023 | Yan et al. |
| 2023/0335509 A1 | 10/2023 | Poddar |
| 2023/0365086 A1 | 11/2023 | Schumacher et al. |
| 2023/0370062 A1 | 11/2023 | Wolf |
| 2023/0378022 A1 | 11/2023 | Kim et al. |
| 2023/0386963 A1 | 11/2023 | Kim et al. |
| 2023/0402930 A1 | 12/2023 | Corry et al. |
| 2023/0420968 A1 | 12/2023 | Oner et al. |
| 2023/0421049 A1 | 12/2023 | Neidorff |
| 2024/0006869 A1 | 1/2024 | Kim et al. |
| 2024/0006899 A1 | 1/2024 | Wernerus |
| 2024/0006993 A1 | 1/2024 | Barjati et al. |
| 2024/0022187 A1 | 1/2024 | Fassnacht |
| 2024/0022240 A1 | 1/2024 | Balaz |
| 2024/0022244 A1 | 1/2024 | S et al. |
| 2024/0030730 A1 | 1/2024 | Wernerus |
| 2024/0039062 A1 | 2/2024 | Wernerus |
| 2024/0039402 A1 | 2/2024 | Bafna et al. |
| 2024/0039406 A1 | 2/2024 | Chen et al. |
| 2024/0048048 A1 | 2/2024 | Zhang |
| 2024/0055488 A1 | 2/2024 | Lee et al. |
| 2024/0067116 A1 | 2/2024 | Qiu |
| 2024/0072675 A1 | 2/2024 | Formenti et al. |
| 2024/0072817 A1 | 2/2024 | K et al. |
| 2024/0077899 A1 | 3/2024 | Chitnis et al. |
| 2024/0078204 A1 | 3/2024 | Roehrle et al. |
| 2024/0079950 A1 | 3/2024 | Narayanasamy |
| 2024/0079958 A1 | 3/2024 | Kumar et al. |
| 2024/0080028 A1 | 3/2024 | Dake et al. |
| 2024/0088647 A1 | 3/2024 | Ramadass et al. |
| 2024/0088896 A1 | 3/2024 | Bilhan et al. |
| 2024/0097437 A1 | 3/2024 | Goyal et al. |
| 2024/0097459 A1 | 3/2024 | Swoboda et al. |
| 2024/0105276 A1 | 3/2024 | Duryea |
| 2024/0106248 A1 | 3/2024 | Woll et al. |
| 2024/0106435 A1 | 3/2024 | Zhang et al. |
| 2024/0113517 A1 | 4/2024 | Sriraj et al. |
| 2024/0113611 A1 | 4/2024 | Kaufmann et al. |
| 2024/0113620 A1 | 4/2024 | Ranmuthu et al. |
| 2024/0113624 A1 | 4/2024 | Southard et al. |
| 2024/0120558 A1 | 4/2024 | Zhang et al. |
| 2024/0120765 A1 | 4/2024 | Oner et al. |
| 2024/0120962 A1 | 4/2024 | Miriyala et al. |
| 2024/0128851 A1 | 4/2024 | Ruck et al. |
| 2024/0128859 A1 | 4/2024 | Chen |
| 2024/0128867 A1 | 4/2024 | Wang et al. |
| 2024/0146177 A1 | 5/2024 | Mehdi et al. |
| 2024/0146306 A1 | 5/2024 | Ramkaj et al. |
| 2024/0149734 A1 | 5/2024 | Eisenlauer |
| 2024/0162723 A1 | 5/2024 | Zipf et al. |
| 2024/0178756 A1 | 5/2024 | El-Markhi et al. |
| 2024/0178824 A1 | 5/2024 | Kazama et al. |
| 2024/0186803 A1 | 6/2024 | Krieg et al. |
| 2024/0198937 A1 | 6/2024 | Benqassmi et al. |
| 2024/0198938 A1 | 6/2024 | Carlos et al. |

(56) References Cited

U.S. PATENT DOCUMENTS

| | | |
|---|---|---|
| 2024/0204540 A1 | 6/2024 | Majmunovic et al. |
| 2024/0204541 A1 | 6/2024 | Majmunovic et al. |
| 2024/0204671 A1 | 6/2024 | Liu et al. |
| 2024/0204765 A1 | 6/2024 | Dake |
| 2024/0213874 A1 | 6/2024 | Junnarkar et al. |
| 2024/0213971 A1 | 6/2024 | Lee |
| 2024/0213975 A1 | 6/2024 | Narayanasamy |
| 2024/0213981 A1 | 6/2024 | Agarwal et al. |

FOREIGN PATENT DOCUMENTS

| | | |
|---|---|---|
| WO | 2020156820 A1 | 8/2020 |
| WO | 2020239797 A1 | 12/2020 |
| WO | 2021110405 A1 | 6/2021 |
| WO | 2021213728 A1 | 10/2021 |
| WO | 2022012943 A1 | 1/2022 |
| WO | 2022229149 A1 | 11/2022 |
| WO | 2023006491 A1 | 2/2023 |
| WO | 2023046607 A1 | 3/2023 |
| WO | 2023094053 A1 | 6/2023 |
| WO | 2023110991 A1 | 6/2023 |
| WO | 2023147907 A1 | 8/2023 |
| WO | 2023151850 A1 | 8/2023 |
| WO | 2023227278 A1 | 11/2023 |
| WO | 2023237248 A1 | 12/2023 |
| WO | 2024006181 A2 | 1/2024 |
| WO | 2024012743 A1 | 1/2024 |
| WO | 2024012744 A1 | 1/2024 |
| WO | 2024022219 A1 | 2/2024 |
| WO | 2024041776 A1 | 2/2024 |
| WO | 2024046614 A1 | 3/2024 |
| WO | 2024049730 A1 | 3/2024 |
| WO | 2024049884 A1 | 3/2024 |
| WO | 2024049909 A1 | 3/2024 |
| WO | 2024056388 A1 | 3/2024 |
| WO | 2024068065 A1 | 4/2024 |
| WO | 2024068076 A1 | 4/2024 |
| WO | 2024068113 A1 | 4/2024 |
| WO | 2024068115 A1 | 4/2024 |
| WO | 2024083391 A1 | 4/2024 |
| WO | 2024093384 A1 | 5/2024 |
| WO | 2024104970 A1 | 5/2024 |
| WO | 2024108401 A1 | 5/2024 |
| WO | 2024110106 A1 | 5/2024 |
| WO | 2024110265 A1 | 5/2024 |
| WO | 2024110297 A1 | 5/2024 |
| WO | 2024114978 A1 | 6/2024 |
| WO | 2024114979 A1 | 6/2024 |
| WO | 2024114980 A1 | 6/2024 |
| WO | 2024128286 A1 | 6/2024 |
| WO | 2024132249 A1 | 6/2024 |

OTHER PUBLICATIONS

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

Balogh, L., "Fundamentals of MOSFET and IGBT Gate Driver Circuits," Texas Instruments Application Report, SLUA618-March (2017), Retrieved from internet URL: https://ghioni.faculty.polimi.it/pel/readmat/gate-drive.pdf, 65 pages.

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual- Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/IEEE/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

* cited by examiner

SYSTEMS AND METHODS FOR OSCILLATOR CALIBRATOR FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for an oscillator calibrator for an inverter for an electric vehicle, and, more particularly, to systems and methods for an oscillator calibrator for a power switch for an inverter for an electric vehicle.

BACKGROUND

Inverters, such as those used to drive a motor in an electric vehicle, for example, are responsible for converting High Voltage Direct Current (HVDC) into Alternating Current (AC) to drive the motor. In an inverter, disparities in oscillator frequencies can contribute to the inefficiencies of the inverter.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: a galvanic isolator separating a high voltage area from a low voltage area; a low voltage phase controller in the low voltage area, the low voltage phase controller configured to receive a clock reference signal; and a high voltage phase controller in the high voltage area, the high voltage phase controller configured to align a clock reference signal of the high voltage phase controller with the clock reference signal of the low voltage phase controller.

In some aspects, the techniques described herein relate to a system, wherein the low voltage phase controller includes a clock reference sampler configured to align the clock reference signal of the low voltage phase controller with a clock reference signal of an inverter controller.

In some aspects, the techniques described herein relate to a system, wherein the low voltage phase controller includes a clock reference sampler configured to align the clock reference signal of the low voltage phase controller with a clock reference signal of an inverter controller when the clock reference signal of the inverter controller is available, and with a clock reference signal of another low voltage phase controller when the clock reference signal of the inverter controller is unavailable.

In some aspects, the techniques described herein relate to a system, wherein the inverter further includes a point-of-use phase controller in the high voltage area, the point-of-use phase controller configured to align a clock reference signal of the point-of-use phase controller with the clock reference signal of the high voltage phase controller.

In some aspects, the techniques described herein relate to a system, wherein the low voltage phase controller includes a clock reference sampler configured to align the clock reference signal of the low voltage phase controller with a primary clock reference signal by counting a number of system clock pulses in one or more periods of the primary clock reference signal and comparing the counted number to an expected value.

In some aspects, the techniques described herein relate to a system, wherein the low voltage phase controller includes a clock calibrator configured to increase or decrease a period of an internal oscillator of the low voltage phase controller to align the counted number to the expected value.

In some aspects, the techniques described herein relate to a system, wherein the high voltage phase controller includes a clock reference sampler configured to align the clock reference signal of the high voltage phase controller with the clock reference signal of the low voltage phase controller by counting a number of system clock pulses in one or more periods of the clock reference signal of the low voltage phase controller and comparing the counted number to an expected value.

In some aspects, the techniques described herein relate to a system, further including: the battery configured to supply the DC power to the inverter; and the motor configured to receive the AC power from the inverter to drive the motor.

In some aspects, the techniques described herein relate to a system including: a power module for an inverter for an electric vehicle, the power module including: a power switch including a drain terminal, a source terminal, and a gate terminal; a gate driver configured to provide a signal to the gate terminal to control an operation of the power switch; and a point-of-use phase controller configured to align a clock reference signal of the point-of-use phase controller with a clock reference signal of a high voltage phase controller, and control the gate driver based on the clock reference signal of the point-of-use phase controller.

In some aspects, the techniques described herein relate to a system, wherein the point-of-use phase controller is configured to align the clock reference signal of the point-of-use phase controller with the clock reference signal of the high voltage phase controller by counting a number of system clock pulses in one or more periods of the clock reference signal of the high voltage phase controller and comparing the counted number to an expected value.

In some aspects, the techniques described herein relate to a system, wherein the point-of-use phase controller is further configured to increase or decrease a period of an internal oscillator of the point-of-use phase controller to align the counted number to the expected value.

In some aspects, the techniques described herein relate to a system, wherein the point-of-use phase controller is further configured to iteratively perform the alignment of the oscillator of the point-of-use phase controller with the clock reference signal of the high voltage phase controller so that successive counts of the number of system clock pulses brings the oscillator of the point-of-use phase controller into alignment with the clock reference signal of the high voltage phase controller.

In some aspects, the techniques described herein relate to a system, wherein the point-of-use controller is configured to align the clock reference signal of the point-of-use phase controller with the clock reference signal of the high voltage phase controller using a command bus for an initial alignment after initialization of the point-of-use controller, and using a message bus for subsequent alignments after the initial alignment.

In some aspects, the techniques described herein relate to a system, wherein the clock reference signal of a high voltage phase controller has a frequency from approximately 100 Hz to approximately 10 kHz.

In some aspects, the techniques described herein relate to a system including: a first controller configured to: receive a clock reference signal of a primary controller; align an oscillator of the first controller with the clock reference signal of the primary controller; and provide a reference signal to a second controller based on a clock reference signal of the aligned oscillator of the first controller.

In some aspects, the techniques described herein relate to a system, wherein the first controller is further configured to count a number of system clock pulses in one or more periods of the clock reference signal of the primary controller, and compare the counted number to an expected value to align the oscillator of the first controller with the clock reference signal of the primary controller.

In some aspects, the techniques described herein relate to a system, wherein the first controller is further configured to increase or decrease a period of the oscillator of the first controller to align the counted number to the expected value to align the oscillator of the first controller with the clock reference signal of the primary controller.

In some aspects, the techniques described herein relate to a system, wherein the first controller is further configured to iteratively perform the alignment of the oscillator of the first controller with the clock reference signal of the primary controller so that successive counts of the number of system clock pulses brings the oscillator of the first controller into alignment with the clock reference signal of the primary controller.

In some aspects, the techniques described herein relate to a system, wherein the first controller is configured to provide the reference signal to the second controller upon alignment of the oscillator of the first controller with the clock reference signal of the primary controller.

In some aspects, the techniques described herein relate to a system, wherein the reference signal to the second controller is a defined number of clock pulses of the oscillator of the first controller for a defined period of time.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
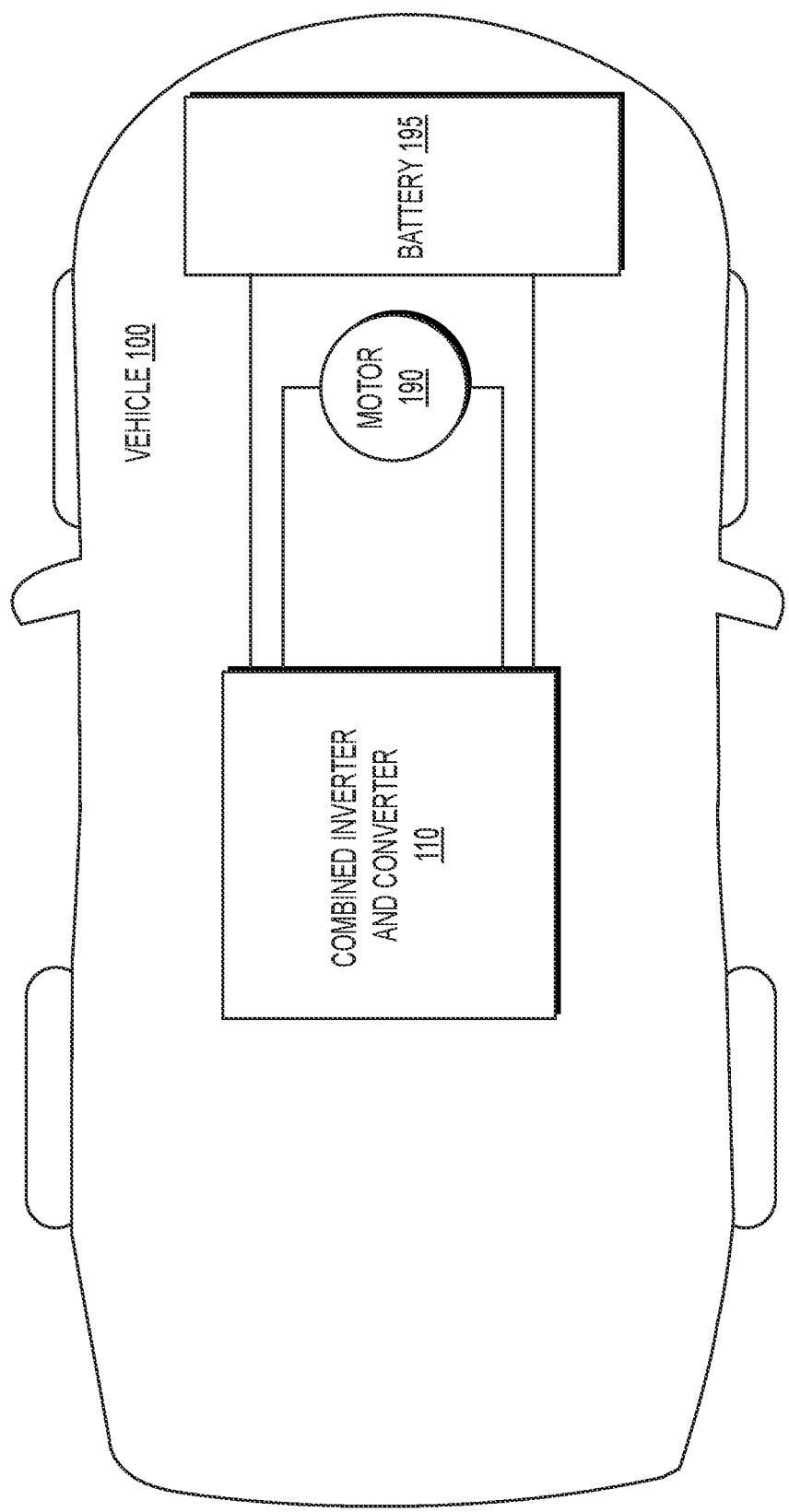
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for an oscillator calibrator for an inverter for an electric vehicle, and, more particularly, to systems and methods for an oscillator calibrator for a power switch for an inverter for an electric vehicle.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three half-H bridge switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the half-H bridge switches. The half-H bridge switches may drive the phase voltage. The inverter may include an isolation barrier between low voltage and high voltage planes. Signals may pass from the PWM controller to the half-H bridge switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the half-H switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5 A to 15 A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

Gate driver circuits may include various oscillators to provide a clock reference signal used in various operations in the inverter. Oscillator frequency variation between multiple controllers connected by a common communications bus may be a major source of uncertainty in the exchange of information between controllers. For example, a first controller without onboard non-volatile memory may have a wide variation in oscillator frequency with respect to a second controller. This disparity in oscillator frequency may result in either degraded communications reliability or a complicated communications protocol in order to overcome the potential uncertainty in communications resulting from this disparity.

One or more embodiments may trim an oscillator frequency of a high voltage controller to an oscillator frequency of a low voltage controller to a high degree of accuracy. One or more embodiments may trim an oscillator frequency of a point-of use controller. One or more embodiments may include an isolated gate-driver with a low-voltage (LV) PWM signal domain and a high-voltage (HV) phase domain. One or more embodiments may include transceivers that allow communication between LV and HV domains. One or more embodiments may include a clock reference sampler to sample and align the LV domain to an external crystal clock reference, and may have less than a one percent error. One or more embodiments may include a clock calibrator to align the HV domain clock to the LV domain clock so that all timing is synchronized. One or more embodiments may synchronize all voltage domains of a phase switch to an absolute clock reference that has less than one percent error.

One or more embodiments may perform an initial trim operation during controller initialization using a handshaking procedure to ensure that both controllers are prepared to perform the trim operation. One or more embodiments may determine whether the trim operation should be performed, and may continuously and independently perform the determination on any controller with an oscillator.

The initial trim operation may use a waveform transmitted by a low voltage controller to the high voltage controller on a command bus over a galvanic isolation interface between the high voltage controller and the low voltage controller. The waveform may have a predetermined period, and the high voltage controller may use a successive approximation algorithm to manipulate trim inputs of the oscillator of the high voltage controller to attain the proper oscillator frequency.

After the initial trim operation has been performed, subsequent trim operations may be performed using a message bus, rather than the command bus, over the galvanic isolation interface using a message transmitted using a standard communications protocol. The subsequent trim operations may not interfere with command bus communications between the high voltage controller and the low voltage controller that may be occurring during the subsequent trim operations.

One or more embodiments may remove the need to have an oscillator trim value for a controller stored in non-volatile memory. One or more embodiments may correct any drift in oscillator frequency due to temperature effects and component drift or aging by performing the trim operation upon controller initialization and periodically during operation. One or more embodiments may remove the need for dedicated pins and external components to improve oscillator frequency matching between controllers. By removing the need for non-volatile memory on-board a controller, one or more embodiments may provide cost savings due to reduced component count, testing, and process complexity. One or more embodiments may provide more robust and faster communications between controllers due to simplifying a communication protocol. One or more embodiments may improve a low voltage controller oscillator using an external oscillator reference. One or more embodiments may improve timing measurements performed by peripheral controllers, such as a high voltage controller and a point-of use controller, for example, due to the trimming of oscillators of the peripheral controllers to match the oscillator of the low voltage controller. One or more embodiments may provide tight matching of clock frequency between controllers and cost savings due to performing the oscillator trim locally to the controllers.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
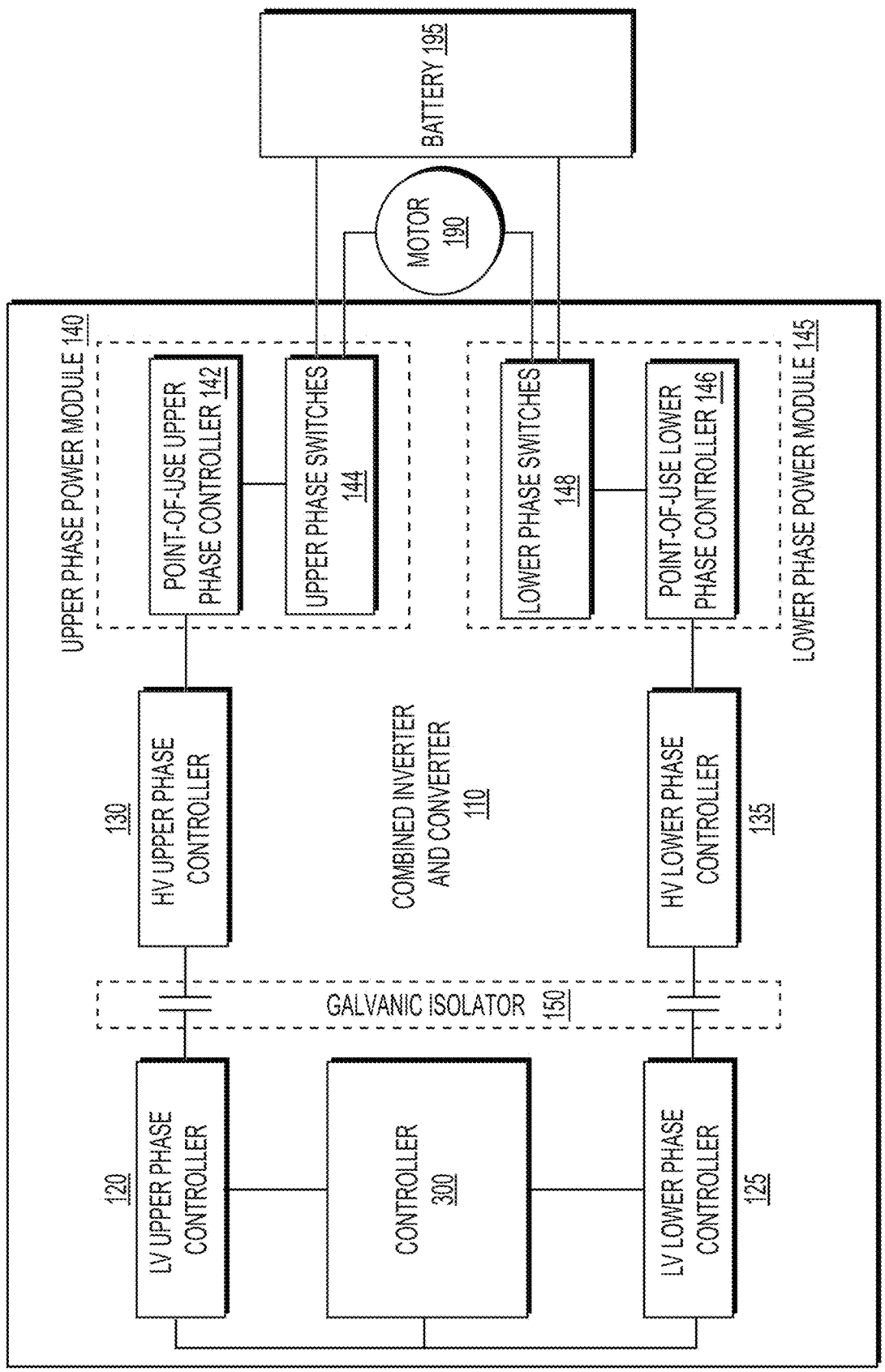
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries an inverse data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
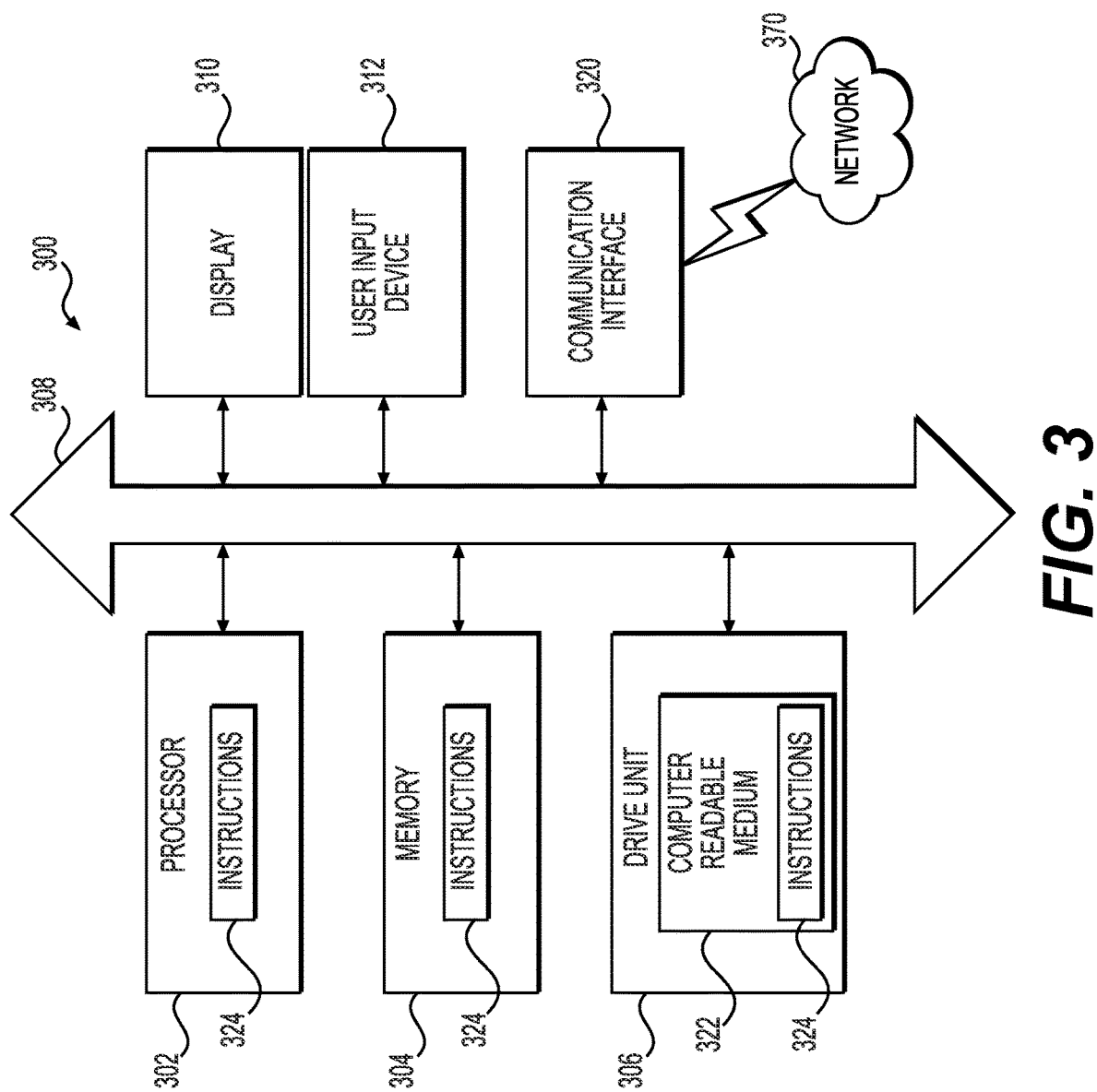
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
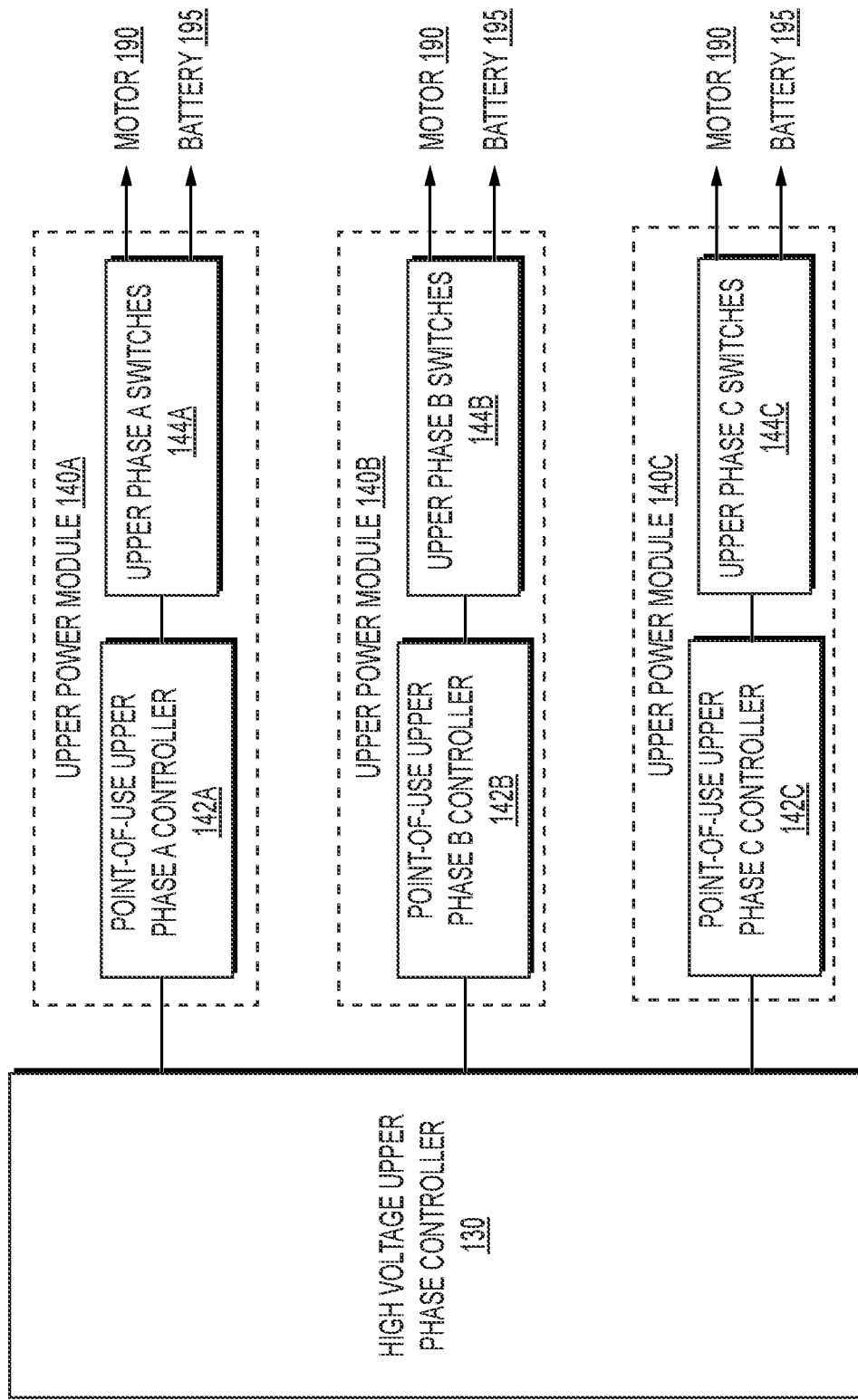
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
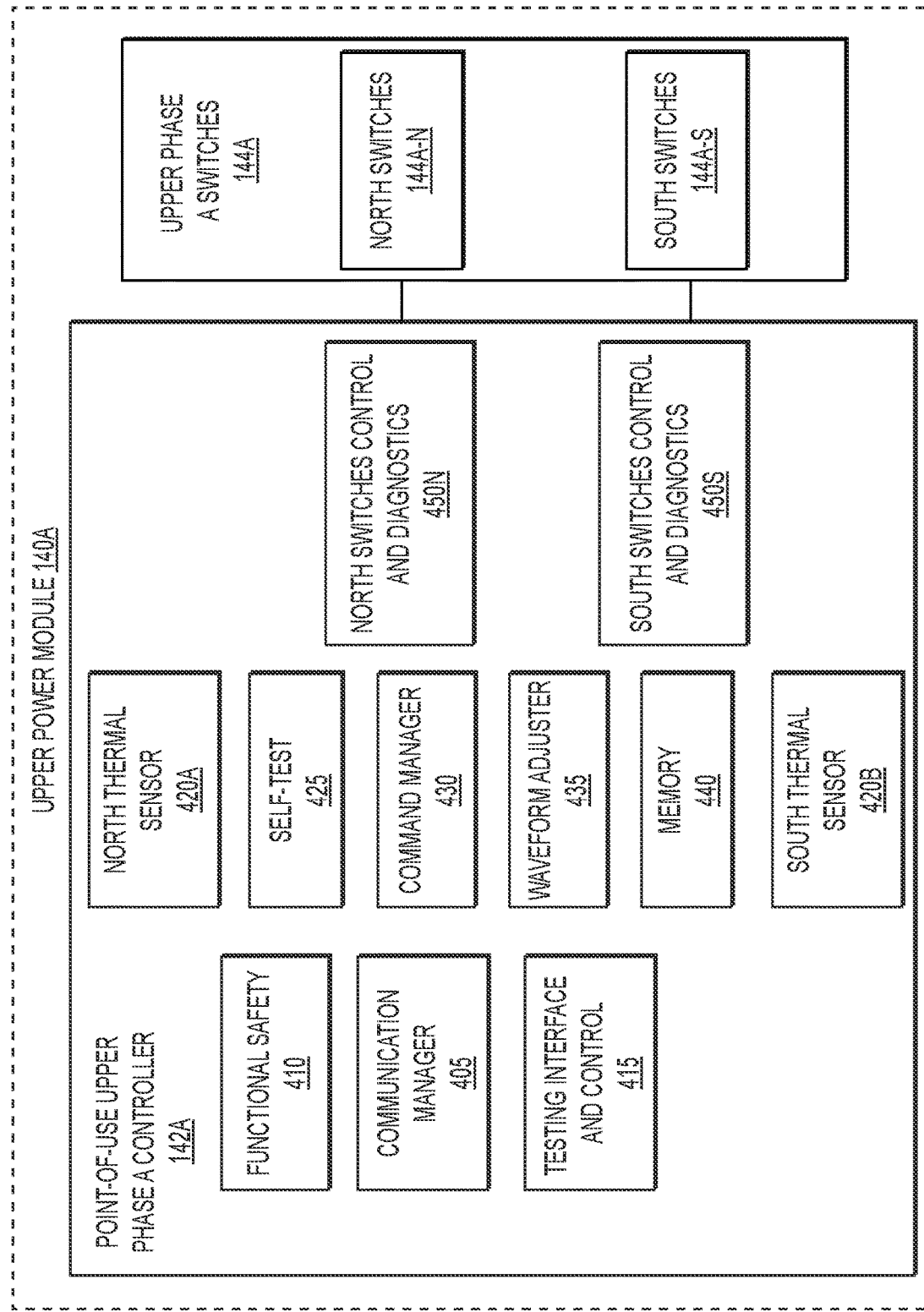
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
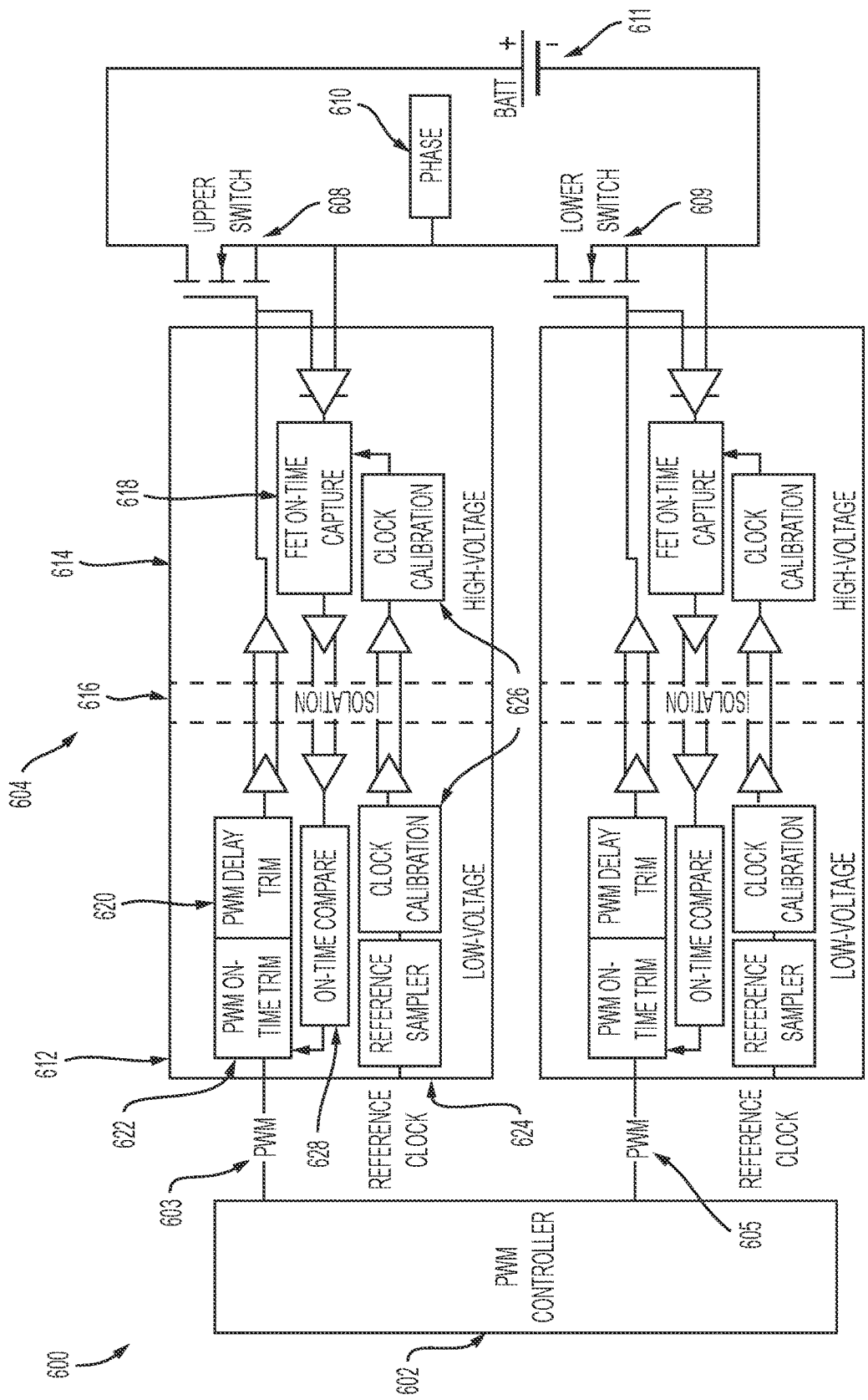
FIG. 6 depicts an exemplary system infrastructure for an inverter with a controller including oscillator calibration, according to one or more embodiments.

FIG. 6 depicts an exemplary system infrastructure for an inverter with a controller including oscillator calibration, according to one or more embodiments. FIG. 6 may include an inverter 600 that includes a PWM controller 602, an upper gate driver 604, a lower gate driver 606, an upper phase switch 608, and a lower phase switch 609. Upper phase switch 608 and lower phase switch 609 may provide a switchable connection between battery 611 and phase connector 610, which may be connected to motor 190, for example, to drive motor 190. The PWM controller 602 may generate a primary clock reference signal, and may provide the primary clock reference signal as PWM signal 603 to upper gate driver 604, and may provide the primary clock reference signal as PWM signal 605 to lower gate driver 606.

The upper gate driver 604 may include a low voltage area 612 and a high voltage area 614, which are separated by a galvanic isolator 616. The low voltage area 612 may accept PWM signal 603 from the PWM controller 602, and transfer the PWM signal across the galvanic isolator 616 to the high voltage area 614, which may then drive upper phase switch 608. Here, upper gate driver 604 may drive upper phase switch 608, and lower gate driver 606 may drive lower phase switch 609.

The inverter 600 may be an implementation of inverter 110. PWM controller 602 may be an implementation of inverter controller 300. Upper gate driver 604 may be an implementation of low voltage upper phase controller 120 and one or more of high voltage upper phase controller 130 or point-of-use upper phase controller 142. Lower gate driver 606 may be an implementation of low voltage lower phase controller 125 and one or more of high voltage lower phase controller 135 or point-of-use lower phase controller 146. Upper phase switch 608 may be an implementation of upper phase switches 144. Lower phase switch 609 may be an implementation of lower phase switches 148. Low voltage area 612 may be an implementation of low voltage upper phase controller 120. High voltage area 614 may be an implementation of one or more of high voltage upper phase controller 130 or point-of-use upper phase controller 142. Galvanic isolator 616 may be an implementation of galvanic isolator 150.

The high voltage area 614 may include a phase switch on-time detector 618, which may measure and store the actual on-time of upper phase switch 608 and send this information, in the form of an encoded message, for example, to the low voltage area 612 of the upper gate driver 604. For example, phase switch on-time detector 618 may detect a number of pulses of a system clock that occurred while the upper phase switch 608 was detected to be turned on. Phase switch on-time detector 618 may measure on an actual on-time of upper phase switch 608 using a gate to source voltage, for example, of upper phase switch 608. Phase switch on-time detector 618 may measure on an actual on-time of upper phase switch 608 using the absolute value of the current, for example, through the upper phase switch 608. Phase switch on-time detector 618 may measure on an actual on-time of upper phase switch 608 using an absolute value of a drain to source voltage, for example, of upper phase switch 608, such as when the voltage is above a threshold value.

For the gate to source voltage, the gate to source waveform may be divided into three charge phases: (i) $Q_{gs1}$ phase—switching charge needed reach the threshold voltage, (ii) $Q_{gd}$ phase—switching charge needed to switch the drain to source voltage, and (iii) $Q_{gs2}$ phase—switching charge needed to reach full enhancement. The phase switch on-time detector 618 may detect each of these three phases by monitoring the gate to source voltage and gate to source current of upper phase switch 608. Shoot-through may be avoided if the upper phase switch 608, which is switching off, has reached the $Q_{gs1}/Q_{gd}$ boundary before the lower phase switch 609, which is switching on, has started the $Q_{gs1}$ phase. For example, the phase switch on-time detector 618 can start the on-time counter at the beginning of the $Q_{gs1}$ turn-on phase and maintain the counter running while the upper phase switch 608 turns completely on through the end of the Qgs2 phase. The counter then continues to run after the upper phase switch 608 is commanded to turn off and stops counting when the upper phase switch 608 reaches the Qgd to Qgs1 boundary as upper phase switch 608 is commanded off. This defines "on-time" as the time where there is any possibility that the upper phase switch 608 can be conducting current and ensures that the on-time of opposing upper phase switch 608 and lower phase switch 609 do not overlap.

The low voltage area 612 may include an on-time comparator 628 configured to receive the information, such as in an encoded message providing a feedback signal, from the phase switch on-time detector 618, and compare the received feedback signal to the PWM signal 603 as a feedback comparison. The low voltage area 612 may include a PWM on-time trimmer 622, which may use the feedback comparison from on-time comparator 628 to generate a programmable delay of the rising or falling edges of PWM signal 603. The programmable delay may be generated so that the commanded duty cycle at the upper phase switch 608 is the same as the incoming PWM duty cycle from the PWM controller 602, as defined by PWM signal 603.

The low voltage area 612 may further include a PWM delay trimmer 620, which may trim the incoming signal such that the absolute delay of PWM edges is the same for parallel gate drivers, including upper gate driver 604. For example, PWM signal 603 may be sent to two upper phase gate drivers, so that the two upper phase receive PWM signal 603 in parallel. The two upper phase gate drivers may have propagation delays and other circuit characteristics that are different from one another. Therefore, without correction, the different circuit delays result in output phase switch switching times that are different from one another, even though the PWM signal 603 input to the circuits is the same. PWM delay trimmer 620 provides a trim operation to delay the PWM signal 603 by an individual amount for each phase gate driver so that the two upper phase gate drivers have the same output phase switch switching times based on PWM signal 603, even with different circuit characteristics.

The low voltage area 612 may further include a clock reference sampler 624, which samples an external clock reference to align the low voltage domain clock to an external precision reference. For example, clock reference sampler 624 may be configured to align the clock reference signal of the upper gate driver 604 with a clock reference signal of the PWM controller 602. Both the low voltage area 612 and high voltage area 614 may include a respective clock calibrator 626 to align the clocks, or oscillators, of the low voltage area 612 and high voltage area 614. Respective clock calibrators 626 may each include an oscillator, or the oscillators may be separate from the respective clock calibrator 626. The functions of clock calibrator 626 may be included in communication manager 405, for example. For example, clock reference sampler 624 may count the number of system clock pulses in one or more periods of the incoming reference clock signal, and compare that number to an expected value. The reference clock frequency may be a value from approximately 100 Hz to approximately 10 kHz, for example. The clock calibrator 626 in low voltage area 612 may increase or decrease the period of an internal oscillator in low voltage area 612 to align the system clock count to the expected value. The procedure may occur in a single operation or may be iterative such that successive reference clock samples brings the LV internal oscillator into alignment with the reference clock. The clock alignment may run periodically over time to make adjustments to account for drift that may occur due to aging of the circuit or changes in temperature, for example.

The clock calibrator 626 in low voltage area 612 may send updates to clock calibrator 626 in high voltage area 614 when adjustments to the clock calibrator 626 in low voltage area 612 are made so that the low and high voltage clocks are aligned. The clock calibrator 626 in high voltage area 614 may operate in a similar manner to clock calibrator 626 in low voltage area 612, and may receive a reference signal, compare the reference signal to an internally expected value, and make adjustments accordingly. The clock calibrator 626 in low voltage area 612 may send a data stream to the clock calibrator 626 in high voltage area 614, and the data stream may be a defined number of LV system clock pulses. For example, the defined number may be a defined number of LV system clock pulses to last for approximately 1 mS. The clock calibrator 626 in high voltage area 614 may count the number of system clock pulses during this message time, compare the number to the reference value, and adjust an internal oscillator in the high voltage area 614 based on the comparison. The procedure may occur in a single operation or may be iterative such that successive LV clock samples brings the HV internal oscillator into alignment with the LV internal oscillator. The reference clock signal may be a signal from PWM controller 602, or may be generated by one of upper gate driver 604 or lower gate driver 606 for use by the other gate driver. For example, when a clock signal from PWM controller 602 is available, upper gate driver 604 may synchronize an internal clock to PWM controller 602, and lower gate driver 606 may synchronize an internal clock to upper gate driver 604. When a clock signal from PWM controller 602 is unavailable, lower gate driver 606 may continue to synchronize an internal clock to upper gate driver 604. The clock signal from PWM controller 602 may be unavailable due to a fault on the clock signal, such as a shorted high signal or an open low signal, for example, or a fault with the PWM controller 602 itself. For example, clock reference sampler 624 may set a "no clock" fault after a threshold time has elapsed without a change in the clock signal from PWM controller 602.

Oscillator frequency variation between PWM controller 602, low voltage area 612, high voltage area 614, and a point-of-use controller for upper phase switch 608, for example, may be a major source of uncertainty in the exchange of information between the controllers, if no oscillator calibration is provided. High voltage area 614 of upper gate driver 604 may not include local non-volatile memory, which could result in a wide variation in oscillator frequency with respect to the low voltage area 612 of upper gate driver 604, if no oscillator calibration is provided. This disparity in oscillator frequency may result in either degraded communications reliability or a complicated communications protocol to overcome the potential uncertainty.

One or more embodiments may include clock calibrator 626 to trim the oscillator frequency of the high voltage area 614 of upper gate driver 604 to the oscillator frequency of the low voltage area 612 of upper gate driver 604, to a high degree of accuracy. Clock calibrator 626 may also be used to trim the oscillator frequency of point-of-use controller (such as point-of-use upper phase A controller 142A, for example) for upper phase switch 608, for example.

The initial trim operation may be performed during initialization of the upper gate driver 604 using a handshaking procedure to ensure that clock calibrator 626 in low voltage area 612 and clock calibrator 626 in high voltage area 614 are ready to perform the trim operation when required. Both clock calibrator 626 in low voltage area 612 and clock calibrator 626 in high voltage area 614 may continuously and independently determine whether the trim operation should be performed. For example, there may be several mechanisms that may trigger a recalibration after an initial calibration performed at power up. These mechanisms may include one or more of a periodic timeout, a command by the PWM controller 602, a change in die temperature, an integrity check communication failure between the clock calibrator 626 in low voltage area 612 and clock calibrator 626 in high voltage area 614, or a reset and subsequent re-initialization of one or more of upper gate driver 604 or lower gate driver 606.

For the initial trim operation, clock calibrator 626 in low voltage area 612 may transmit a waveform on the command bus of galvanic isolator 616 to clock calibrator 626 in high voltage area 614. The waveform may have a predetermined frequency, and clock calibrator 626 in high voltage area 614 may implement a successive approximation algorithm to manipulate oscillator circuit trim inputs to calibrate the proper oscillator frequency.

After the initial trim operation has been performed, subsequent trim operations may be performed using only the message bus of galvanic isolator 616 using a message transmitted using a communications protocol. For example, a subsequent trim operation may include a two-message sequence. First, a message may be sent with a header that alerts the high voltage area 614 that a trim operation is desired, so that high voltage area 614 may perform any housekeeping that needs to be performed prior to the trim operation. Next, the trim message itself may be sent. The header of the message may indicate a trim operation, and the message payload may be used by the clock calibrator 626 in high voltage area 614 to perform the trim operation. Similar to an initial trim operation, the message payload may be a waveform with a known period and duration. A message may include three fields: (1) a header field that includes address and identification information, (2) a payload field, the length of which is determined by the header field, and (3) a cyclic redundancy check (CRC) field used for message integrity checking. Using the message bus of galvanic isolator 616 for subsequent trim operations may ensure the oscillator calibration does not interfere with command bus communications that may be occurring during the subsequent trim operations.

A low voltage domain clock calibration between clock calibrator 626 in low voltage area 612 and clock calibrator 626 in high voltage area 614 may include various operations. For example, clock calibrator 626 in low voltage area 612 may receive an oscillator trim request via the message bus of galvanic isolator 616. The oscillator trim request received via the message bus of galvanic isolator 616 from clock calibrator 626 in high voltage area 614 may be formulated such that the trim request will always win contention for the message bus and will initiate the oscillator trim procedure. The clock calibrator 626 in low voltage area 612 may send an oscillator trim acknowledgement via the message bus. The oscillator trim request and acknowledgement may have the same format (width, etc.) and may be formulated such that they always win contention over normal priority message bus communications, but may lose contention to an oscillator trim request from clock calibrator 626 in high voltage area 614.

The clock calibrator 626 in low voltage area 612 may send an oscillator trim waveform via the command bus. The clock calibrator 626 in low voltage area 612 may receive an oscillator trim acknowledgement via the message bus. When an oscillator trim acknowledgement is not received after a threshold time, the clock calibrator 626 in low voltage area 612 may re-send the oscillator trim waveform via the command bus. When an oscillator trim acknowledgement is received, the clock calibrator 626 in low voltage area 612 may enter a mission mode operation.

In the mission mode operation, the clock calibrator 626 in low voltage area 612 may await an oscillator trim request and determine whether a clock calibration should be updated. When a clock calibration should be updated, the clock calibrator 626 in low voltage area 612 may send a clock calibration message via the message bus. The mission mode trim requests may be sent via a series of normal priority message bus messages. The header of the first message may inform the clock calibrator 626 in high voltage area 614 that an oscillator trim message will be sent, followed by the subsequent message, where the header informs the clock calibrator 626 in high voltage area 614 of the oscillator trim operation being performed. The payload of the message may include a number of bits that will be used by the clock calibrator 626 in high voltage area 614 to count clock cycles to determine the oscillator trim value needed to synchronize frequency of the clock calibrator 626 in high voltage area 614 with respect to the clock calibrator 626 in low voltage area 612.

In a reset operation, the clock calibrator 626 in low voltage area 612 may complete a startup configuration, and await an oscillator trim request. When a post-configuration timeout has elapsed, the clock calibrator 626 in low voltage area 612 may send an oscillator trim request via the message bus. If an oscillator trim request is not received within a threshold time, the clock calibrator 626 in low voltage area 612 may re-send the oscillator trim request via the message bus. If the oscillator trim request is received, the clock calibrator 626 in low voltage area 612 may send an oscillator trim acknowledgement via the message bus and proceed with the trim operation. As described above, timeouts may exist for some of the operations in the trim procedure to ensure that the clock calibrator 626 in low voltage area 612 does not get stuck. For example, after device initialization/configuration is complete, if an oscillator trim request is not received within a threshold amount of time, the clock calibrator 626 in low voltage area 612 may initiate an oscillator trim request.

A high voltage domain clock calibration between clock calibrator 626 in low voltage area 612 and clock calibrator 626 in high voltage area 614 may include various operations. For example, in a reset operation, the clock calibrator 626 in high voltage area 614 may complete a startup configuration, and send an oscillator trim request via the message bus. If an oscillator trim request is not received within a threshold time, the clock calibrator 626 in high voltage area 614 may re-send the oscillator trim request via the message bus. If the oscillator trim request is received, the clock calibrator 626 in low voltage area 612 may trim the oscillator based on the oscillator trim waveform received via the command bus and send an acknowledgment on the message bus to acknowledge the oscillator trim operation in progress. The clock calibrator 626 in low voltage area 612 may enter a mission mode operation, and await an oscillator trim message. When the oscillator trim message is received via the message bus, the clock calibrator 626 in low voltage area 612 may trim the oscillator based on the oscillator trim waveform received via the message bus.

One or more embodiments may remove the need to have an oscillator trim value for the high voltage area 614 of upper gate driver 604 stored in non-volatile memory of the high voltage area 614 of upper gate driver 604. In addition, any drift in oscillator frequency due to temperature effects and component drift or aging may be effectively corrected by performing the trim operation upon device initialization and periodically during operation of the upper gate driver 604. One or more embodiments may remove the need for dedicated pins and external components to improve oscillator frequency matching between controllers. By removing the need for non-volatile memory on-board the high voltage area 614 of upper gate driver 604, one or more embodiments may exhibit cost savings due to the associated circuit area savings, testing savings, and decreased process complexity. One or more embodiments may be useful for systems that require relatively tight matching of timing or frequency measurements but do not have robust control of on-board oscillator frequency between controllers.

One or more embodiments may include clock calibrator 626 of low voltage area 612 that determines an oscillator frequency difference between an oscillator of low voltage area 612 of upper gate driver 604 and an oscillator of high voltage area 614 of upper gate driver 604, and provides a correction to clock calibrator 626 of high voltage area 614 via the message bus of galvanic isolator 616.

One or more embodiments may provide communications between controllers that is more robust and faster than some solutions by avoiding the need to over specify the timing of the communication protocol. In addition, with the oscillator of low voltage area 612 being improved due to an external reference, such as clock reference sampler 624 from PWM controller 602, for example, timing measurements performed by peripheral controllers may be improved due to the trimming of peripheral oscillators of high voltage area 614 of upper gate driver 604 and point-of-use controller for upper phase switch 608 to match the low voltage area 612 oscillator. One or more embodiments may allow tight matching of clock frequency between controllers while reducing costs of the high voltage area 614 of upper gate driver 604 due to performing the oscillator trim in situ.

Due to this clock alignment, the feedback signal from phase switch on-time detector 618 may be used by the on-time comparator 628 without errors that would occur due to a difference between clocks in the low voltage area 612 and high voltage area 614. The clock alignment may further allow for PWM delay trimmer 620 to add a delay to PWM signal 603 on an individual phase gate driver basis so that all phase switches have the same total delay from the PWM input to the phase voltage output. A tester at end of line manufacturing may measure a time delay between a change of state in a PWM signal and a change of state in the phase voltage. This time delay may not be reduced due to inherent characteristics of the inverter 600. However, the time delay may be increased for individual components. The PWM delay trimmer 620 may be set for each individual phase gate driver based on the longest delay of any individual phase gate driver, so that the final trimmed delay from PWM edge to Phase edge is the same for all phase gate drivers in inverter 600. In this manner, transition times between upper and lower devices are standardized to reduce the possibility of shoot-through. This PWM delay trim may be performed at final end-of-line test, and the clock alignment may ensure that the delay trim remains valid for the life of the inverter 600. As shown in FIG. 6, the lower gate driver 606 may include all of the components and functions described herein for upper gate driver 604, and does therefore not include detailed labels in the drawings or a description herein.

The PWM on-time trim algorithm may require that an on-time pulse be sent to the input of PWM on-time trimmer 622, such as from the PWM controller 602 or by upper gate driver 604 itself in a test mode. This on-time pulse may be at least 5 µS, for example. The on-time comparator 628 may count the number of system clock pulses in the on-time pulse as the on-time pulse enters PWM on-time trimmer 622. The on-time pulse may pass through PWM on-time trimmer 622 and PWM delay trimmer 620 without alteration, and phase switch on-time detector 618 may count the number of clock pulses for the on-time pulse using one of the methods discussed above. Phase switch on-time detector 618 may send the clock count to on-time comparator 628, which compares the on-time comparator 628 count to the count received from phase switch on-time detector 618. On-time comparator 628 may adjust settings in PWM on-time trimmer 622 to match the two clock counts. The process may be repeated and the expected result may be that on-time comparator 628 will observe that phase switch on-time detector 618 has reported the correct value. A PWM delay trim may require that a tester observe a change (rising or falling) in the PWM signal 603 and observe a change (rising or falling) of a voltage at the phase connector 610. The delay between these two events may be the total propagation delay of the command signal. The tester may adjust the settings in PWM delay trimmer 620 to trim this delay to the same value on a part-by-part basis. For example, a delay trim value may be from approximately 100 nS to approximately 500 nS.

Some approaches may include a PWM command signal path from a PWM controller to the half-H switch, but do not include feedback from the high voltage side to the low voltage side for the purpose of fault feedback. Upper gate driver 604 of inverter 600 may include the addition of the phase switch on-time detector 618 in the high voltage area 614. Upper gate driver 604 may include a path for sending on-time data of upper phase switch 608 from high voltage area 614 to on-time comparator 628 in low voltage area 612. The path may pass through the galvanic isolator 616 of the upper gate driver 604. Upper gate driver 604 may include PWM on-time trimmer 622 that may use the on-time data to de-skew the PWM signal path from PWM signal 603 to the upper phase switch 608. Upper gate driver 604 may include a PWM delay trimmer 620 to adjust the absolute delay of PWM edges of PWM signal 603 so that all PWM signal paths within a given design are the same, regardless of circuit characteristics. Upper gate driver 604 may include a clock reference sampler 624 that may trim the low voltage domain clock to an external precision reference. Upper gate driver 604 may include a low voltage area 612 clock calibrator 626 that communicates with a high voltage area 614 clock calibrator 626 so that the low voltage and high voltage clocks are both aligned to an external reference, to ensure that the PWM on-time trimmer 622 and PWM delay trimmer 620 setpoints are stable over time and precisely set for individual paralleled gate drivers.

A respective PWM on-time trimmer 622 and PWM delay trimmer 620 may use a common timing reference for all low voltage and high voltage areas of all gate drivers to maintain timing alignment between all inverter gate drivers on a common phase or between adjacent phases. A respective phase switch on-time detector 618 in all gate drivers may allow the PWM on-time trimmer 622 to maintain the intended PWM duty cycle at the point of use for respective phase switches.

One or more embodiments may trim an oscillator frequency of a high voltage controller to an oscillator frequency of a low voltage controller to a high degree of accuracy. One or more embodiments may trim an oscillator frequency of a point-of-use controller. One or more embodiments may include an isolated gate-driver with a low-voltage (LV) PWM signal domain and a high-voltage (HV) phase domain. One or more embodiments may include transceivers that allow communication between LV and HV domains. One or more embodiments may include a clock reference sampler to sample and align the LV domain to an external crystal clock reference, and may have less than a one percent error. One or more embodiments may include a clock calibrator to align the HV domain clock to the LV domain clock so that all timing is synchronized. One or more embodiments may synchronize all voltage domains of a phase switch to an absolute clock reference that has less than one percent error.

One or more embodiments may remove the need to have an oscillator trim value for a controller stored in non-volatile memory. One or more embodiments may correct any drift in oscillator frequency due to temperature effects and component drift or aging by performing the trim operation upon controller initialization and periodically during operation. One or more embodiments may remove the need for dedicated pins and external components to improve oscillator frequency matching between controllers. By removing the need for non-volatile memory on-board a controller, one or more embodiments may provide cost savings due to reduced component count, testing, and process complexity. One or more embodiments may provide more robust and faster communications between controllers due to simplifying a communication protocol. One or more embodiments may improve a low voltage controller oscillator using an external oscillator reference. One or more embodiments may improve timing measurements performed by peripheral controllers, such as a high voltage controller and a point-of use controller, for example, due to the trimming of oscillators of the peripheral controllers to match the oscillator of the low voltage controller. One or more embodiments may provide tight matching of clock frequency between controllers and cost savings due to performing the oscillator trim locally to the controllers.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
   an inverter configured to convert DC power from a battery to AC power to drive a motor, wherein the inverter includes:
      a galvanic isolator separating a high voltage area from a low voltage area;
      a low voltage phase controller in the low voltage area, the low voltage phase controller configured to receive a clock reference signal; and
      a high voltage phase controller in the high voltage area, the high voltage phase controller configured to align a clock reference signal of the high voltage phase controller with the clock reference signal of the low voltage phase controller.

2. The system of claim 1, wherein the low voltage phase controller includes a clock reference sampler configured to align the clock reference signal of the low voltage phase controller with a clock reference signal of an inverter controller.

3. The system of claim 1, wherein the low voltage phase controller includes a clock reference sampler configured to align the clock reference signal of the low voltage phase controller with a clock reference signal of an inverter controller when the clock reference signal of the inverter controller is available, and with a clock reference signal of another low voltage phase controller when the clock reference signal of the inverter controller is unavailable.

4. The system of claim 1, wherein the inverter further includes a point-of-use phase controller in the high voltage area, the point-of-use phase controller configured to align a clock reference signal of the point-of-use phase controller with the clock reference signal of the high voltage phase controller.

5. The system of claim 1, wherein the low voltage phase controller includes a clock reference sampler configured to align the clock reference signal of the low voltage phase controller with a primary clock reference signal by counting a number of system clock pulses in one or more periods of the primary clock reference signal and comparing the counted number to an expected value.

6. The system of claim 5, wherein the low voltage phase controller includes a clock calibrator configured to increase or decrease a period of an internal oscillator of the low voltage phase controller to align the counted number to the expected value.

7. The system of claim 1, wherein the high voltage phase controller includes a clock reference sampler configured to align the clock reference signal of the high voltage phase controller with the clock reference signal of the low voltage phase controller by counting a number of system clock pulses in one or more periods of the clock reference signal of the low voltage phase controller and comparing the counted number to an expected value.

8. The system of claim 1, further comprising:
   the battery configured to supply the DC power to the inverter; and
   the motor configured to receive the AC power from the inverter to drive the motor.

* * * * *